US010317485B2

(12) United States Patent
Seeber

(10) Patent No.: US 10,317,485 B2
(45) Date of Patent: Jun. 11, 2019

(54) SYSTEM AND METHOD FOR MAGNETIC RESONANCE IMAGING ONE OR MORE SUBJECTS

(71) Applicant: GENERAL ELECTRIC COMPANY, Schenectady, NY (US)

(72) Inventor: Derek Allan Seeber, Florence, SC (US)

(73) Assignee: General Electric Company, Schenectady, NY (US)

( * ) Notice: Subject to any disclaimer, the term of this patent is extended or adjusted under 35 U.S.C. 154(b) by 182 days.

(21) Appl. No.: 15/337,204

(22) Filed: Oct. 28, 2016

(65) Prior Publication Data
US 2018/0120394 A1    May 3, 2018

(51) Int. Cl.
*G01V 3/00* (2006.01)
*G01R 33/385* (2006.01)

(52) U.S. Cl.
CPC ..... *G01R 33/3856* (2013.01); *G01R 33/3858* (2013.01)

(58) Field of Classification Search
CPC .......... H01F 6/06; H01F 41/04; H01F 41/098; H01F 6/04; G01R 33/3804; G01R 33/3815; G01R 33/3856; G01R 33/3858; H01B 12/16; H01B 12/10; H01L 39/143; H01L 39/14
USPC ........................................................ 324/309
See application file for complete search history.

(56) References Cited

U.S. PATENT DOCUMENTS

| 5,334,937 A | 8/1994 | Peck et al. | |
|---|---|---|---|
| 7,045,704 B2 * | 5/2006 | Areskoug | H01F 27/16 174/15.1 |
| 2005/0103519 A1 * | 5/2005 | Brandsberg | H01B 12/02 174/125.1 |
| 2007/0227760 A1 * | 10/2007 | Fischer | H01B 12/10 174/125.1 |
| 2008/0194411 A1 * | 8/2008 | Folts | H01L 39/143 505/110 |
| 2009/0251270 A1 * | 10/2009 | Meinke | G01R 33/3804 336/208 |
| 2009/0251271 A1 * | 10/2009 | Stelzer | H01F 5/02 336/208 |
| 2010/0231215 A1 * | 9/2010 | Ma | G01R 33/3403 324/307 |
| 2012/0214676 A1 * | 8/2012 | Matsushita | H01B 12/02 505/230 |
| 2014/0221213 A1 * | 8/2014 | Fukuda | H01B 12/16 505/163 |
| 2014/0302258 A1 * | 10/2014 | Mathieu | H01F 41/04 427/596 |
| 2015/0107867 A1 * | 4/2015 | Teng | H01R 4/68 174/15.5 |
| 2016/0049225 A1 * | 2/2016 | McIntyre | H01L 39/141 505/163 |
| 2016/0190788 A1 * | 6/2016 | Mitsuhashi | H01R 4/68 174/84 R |
| 2017/0199257 A1 * | 7/2017 | Liu | G01R 33/3804 |
| 2017/0219668 A1 * | 8/2017 | Thiagarajan | G01R 33/3858 |
| 2017/0243681 A1 * | 8/2017 | Somerkoski | H01F 6/06 |

(Continued)

*Primary Examiner* — Rodney E Fuller

(57) ABSTRACT

An MRI system for imaging a subject is provided. The MRI system includes a magnet assembly that includes a gradient coil having a hollow conducting wire. The hollow conducting wire includes a body defining a passageway, and one or more conductors disposed within the body around the passageway.

14 Claims, 5 Drawing Sheets

(56) References Cited

U.S. PATENT DOCUMENTS

| | | | |
|---|---|---|---|
| 2017/0287583 A1* | 10/2017 | Pogue | H01B 1/026 |
| 2017/0338009 A1* | 11/2017 | van der Laan | H01L 39/18 |
| 2018/0100905 A1* | 4/2018 | Mathieu | H01F 41/04 |
| 2018/0158577 A1* | 6/2018 | Xu | C22C 1/0491 |

* cited by examiner

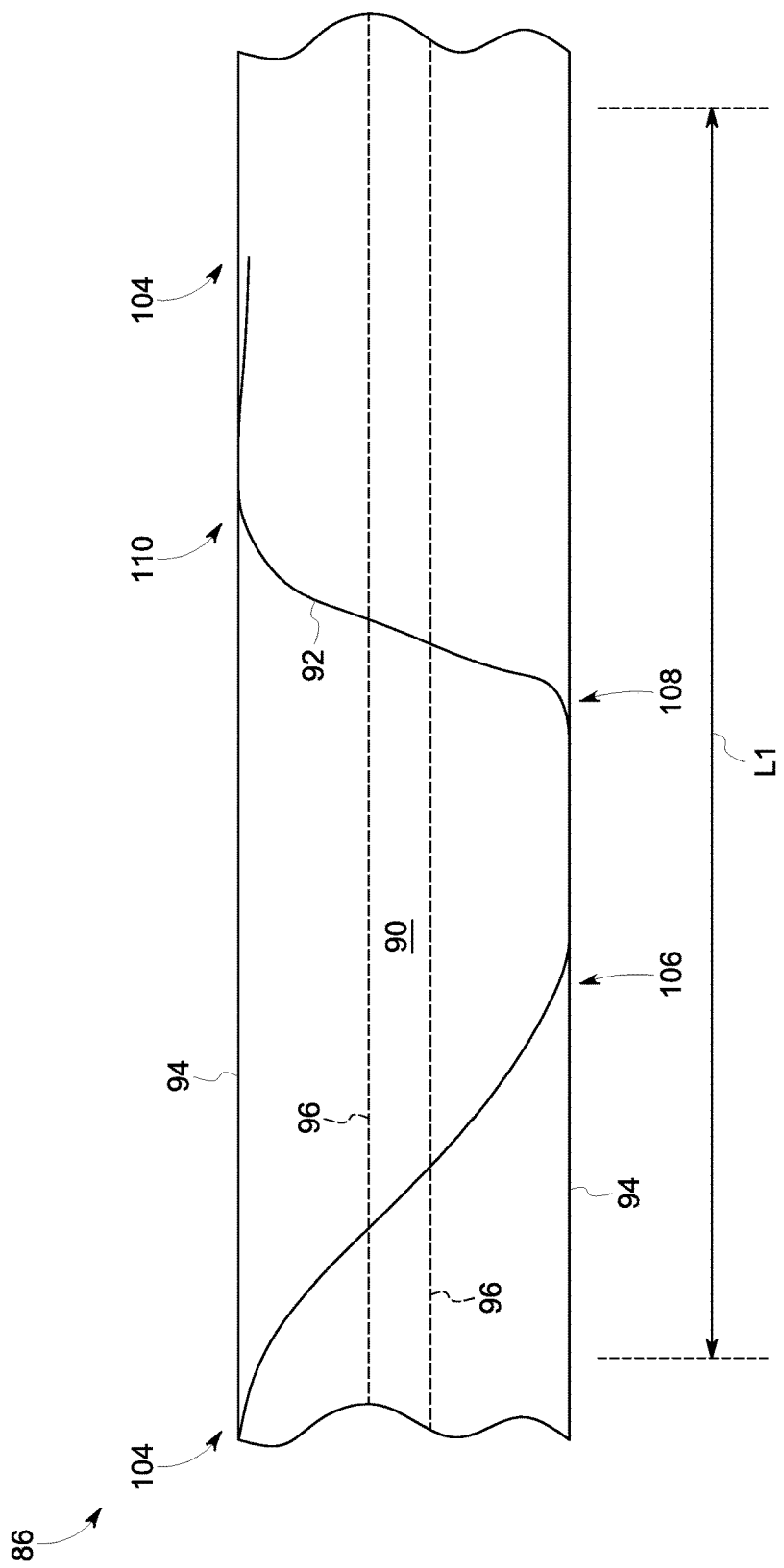

SYSTEM AND METHOD FOR MAGNETIC RESONANCE IMAGING ONE OR MORE SUBJECTS

BACKGROUND

Technical Field

Embodiments of the invention relate generally to superconducting magnets and, more specifically, to a system and method for magnetic resonance imaging one or more subjects.

Discussion of Art

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

Many MRI systems utilize gradient coils to spatially encode the RF responses so that the locations of the nuclei corresponding to the RF response can be determined. Many gradient coils are driven by electrical wires wrapped into coils. As used herein with respect to gradient coils, the terms "driven" and "drive" refer to the generation of a magnetic field resulting from the flow of electrical current through the electrical wires of the gradient coil. Generation of a magnetic field by a gradient coil, however, results in electrical resistance within the electrical wires of the gradient coil. The generation of a magnetic field by a gradient coil may also produce eddy currents within other components of an MRI system, e.g., other gradient coils, RF shields, shim coils, etc., which also contribute to the electrical resistance in the electrical wires of the gradient coil. The amount of electrical resistance within the electrical wires of a gradient coil partially determines the amount of electrical power required to drive the gradient coil, and the amount of power required to drive the gradient coil is usually directly proportional to the cost of operating the encompassing MRI system.

As a result, some MRI systems seek to reduce the amount of resistance within the electrical wires of a gradient coil by mitigating/reducing the amount/magnitude of eddy currents generated in the various components of an MRI by the gradient coil. For example, some MRI systems utilize hollow copper conductors. Hollow copper conductors, however, are typically very expensive to manufacture.

What is needed, therefore, is an improved MRI system and method for imaging one or more subjects.

BRIEF DESCRIPTION

In an embodiment, an MRI system for imaging a subject is provided. The MRI system includes a magnet assembly that includes a gradient coil having a hollow conducting wire. The hollow conducting wire includes a body defining a passageway, and one or more conductors disposed within the body around the passageway.

In another embodiment, a method for magnetic resonance imaging a subject is provided. The method includes driving a gradient coil of a magnet assembly of an MRI system via a hollow conducting wire. The hollow conducting wire includes a body defining a passageway, and one or more conductors disposed within the body around the passageway.

In yet another embodiment, a hollow conducting wire for driving a gradient coil of a magnet assembly of an MRI system is provided. The hollow conducting wire includes a body defining a passageway, and one or more conductors disposed within the body around the passageway.

DRAWINGS

The present invention will be better understood from reading the following description of non-limiting embodiments, with reference to the attached drawings, wherein below:

FIG. 6 is a side cross-sectional view of a hollow conducting wire of a gradient coil of the magnet assembly of FIG. 2 in accordance with an embodiment of the invention.

DETAILED DESCRIPTION

Figure 1:
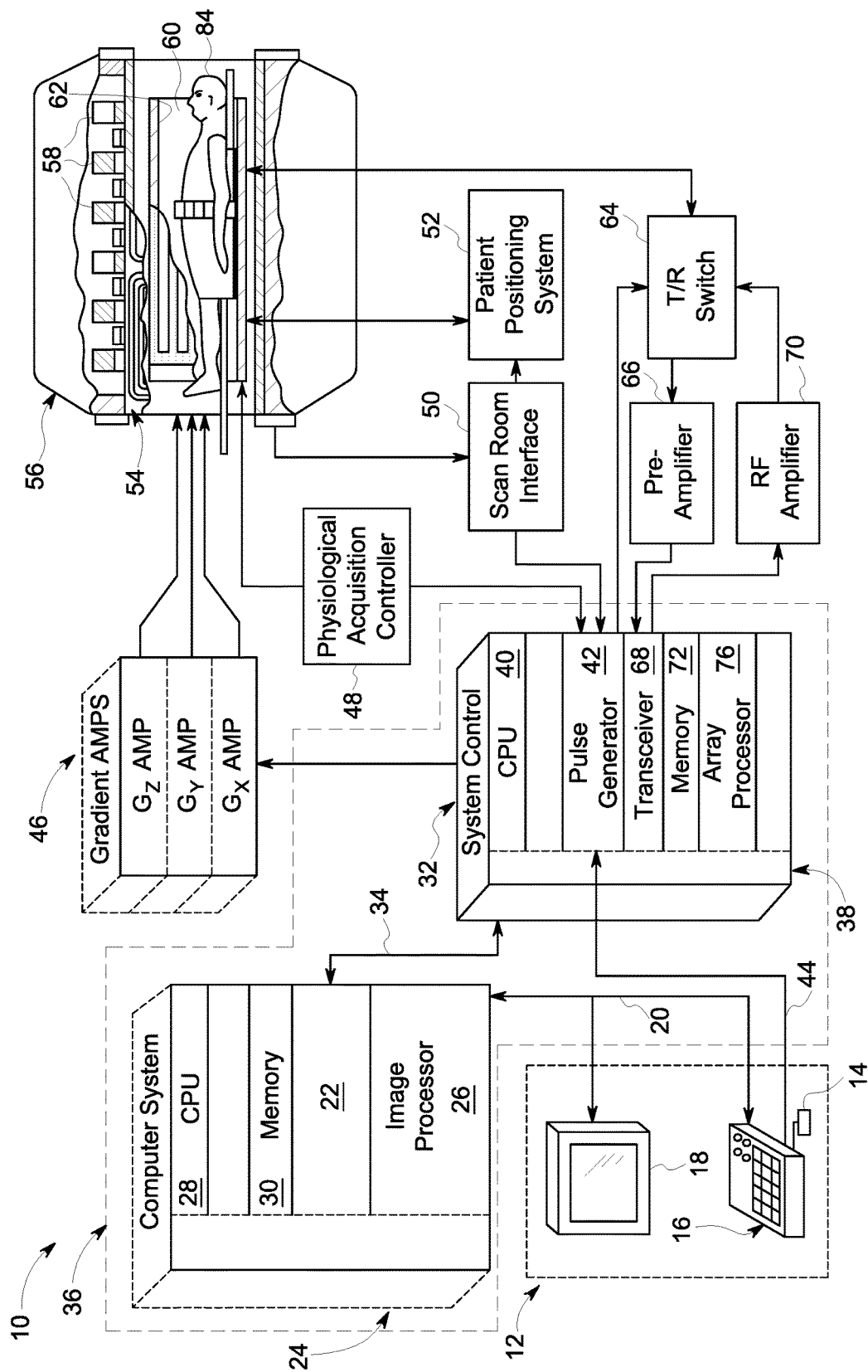
FIG. 1 is a block diagram of an exemplary MRI system in accordance with an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

Further, while the embodiments disclosed herein are described with respect to an MRI system, it is to be understood that embodiments of the present invention may be applicable to other imaging systems. Further still, as will be appreciated, embodiments of the present invention related imaging systems may be used to analyze tissue generally and are not limited to human tissue.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data/datum is rearranged into separate k-space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
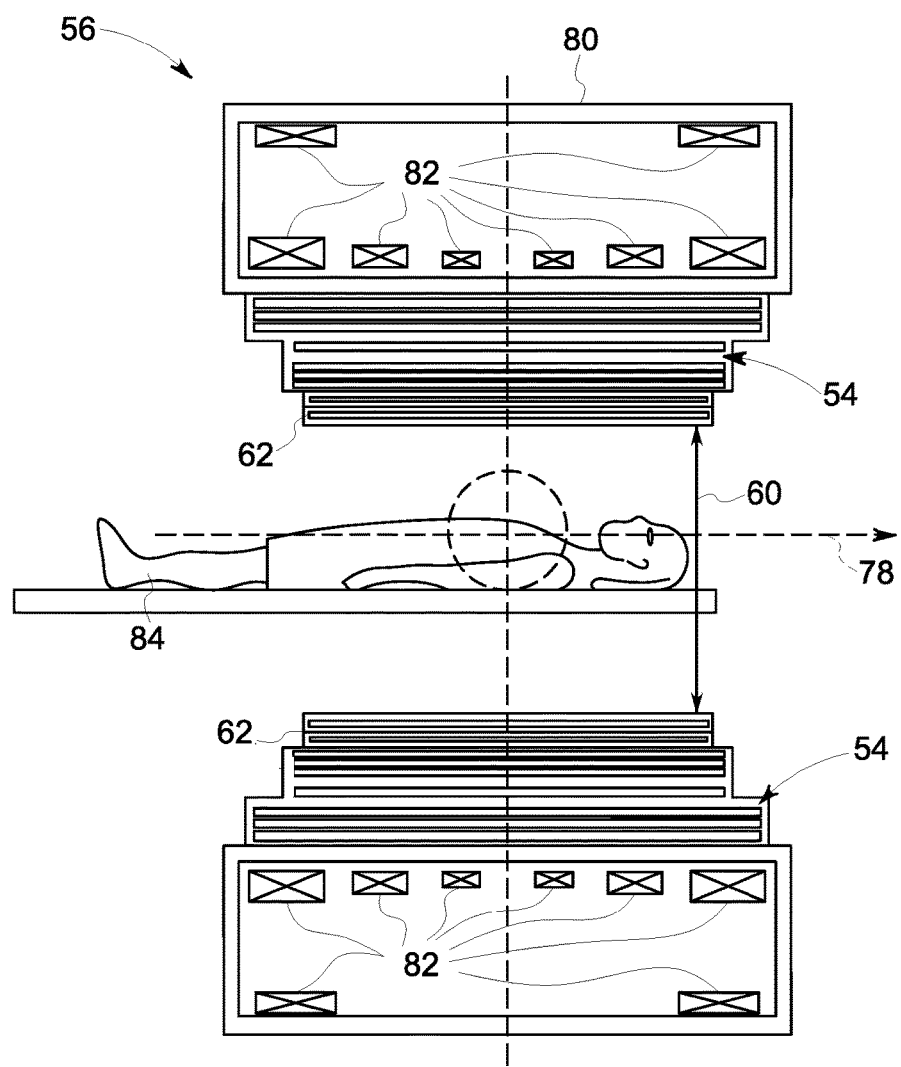
FIG. 2 is a schematic cross-sectional view of a magnet assembly of the MRI system of FIG. 1 in accordance with an embodiment of the invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 3:
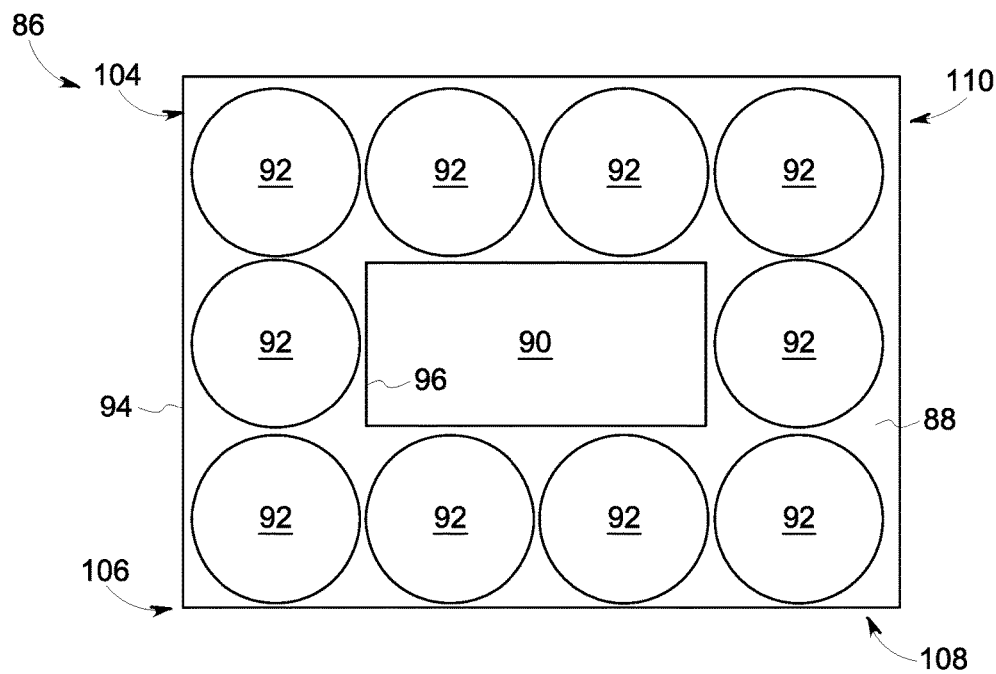
FIG. 3 is an axial cross-sectional view of a hollow conducting wire of a gradient coil of the magnet assembly of FIG. 2 in accordance with an embodiment of the invention.
Figure 4:
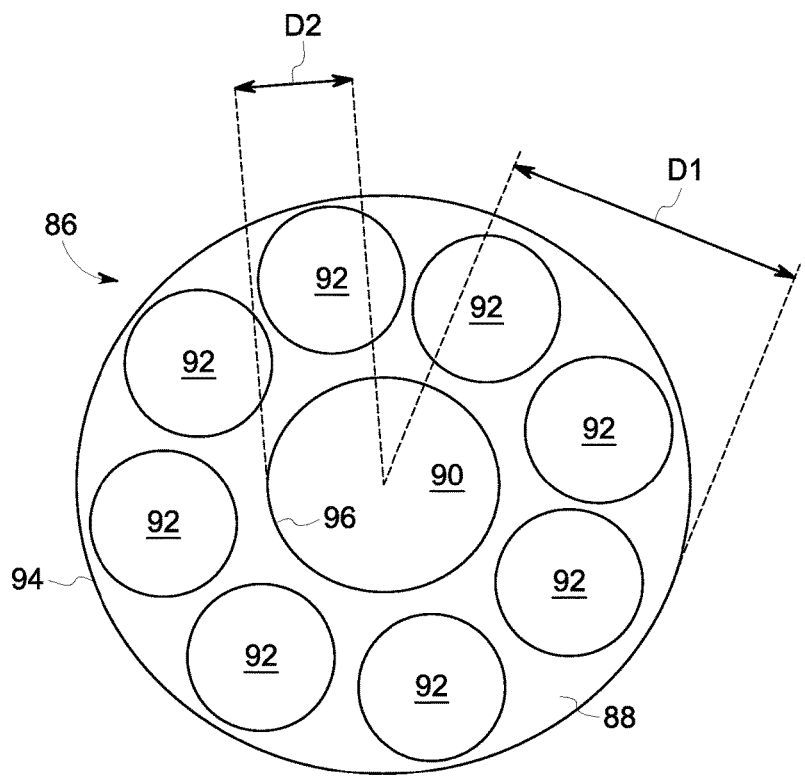
FIG. 4 is an axial cross-sectional view of another embodiment of the hollow conducting wire of FIG. 3 in accordance with an embodiment of the invention.

Turning now to FIGS. 3 and 4, the gradient coils 54 of the magnet assembly 56 may include at least one hollow conducting wire 86 that facilitates generation of a gradient magnetic field by transporting electrical current. Accordingly, the hollow conducting wire 86 includes a body 88 that defines a passageway 90, and one or more conductors 92 disposed within the body 88.

The body 88 has an exterior/exterior side 94 and an interior/interior side 96 and may be made of nylon, ethylene, and/or any other suitable non-conductive plastic or flexible material capable of retaining the conductors 92 in an arrangement/matrix around the passageway 90 as shown in the provided figures. As will be appreciated, the body 88 may have a rectangular shape (shown in FIG. 3), a circular shape (shown in FIG. 4), or any other appropriate shape for inclusion in the gradient coils 54. As shown in FIG. 3, in embodiments with a body 88 having a rectangular shape, the body may be about 11 mm to 12 mm by 8 mm to 9 mm and the passageway may be about 5 mm to 6 mm by 2 mm to 3 mm. As shown in FIG. 4, in embodiments with a body 88 having a circular shape, the body 88 may have an outer diameter D1 of about 11 mm and an inner diameter D2, that defines the passageway 90, of about 4 mm. It is to be appreciated, however, that other embodiments of the body 88 may depart from the aforementioned dimensions.

The conductors 92 may be disposed in the body 88 between the exterior side 94 and the passageway 90, and are for conducting electrical current through the hollow conducting wire 86 which, in embodiments, drives the gradient coils 54. As will be appreciated, in embodiments, up to twenty (20) conductors 92 may be disposed within the body 88, each of which may be of the same/equal size/gage, e.g. American Wire Gage ("AWG") ten (10). It will be understood that while individual conductors 92 within the body 88 may be smaller in size than traditional solid conductors for a gradient coil, the number and arrangement of the conductors 92 may be such that their total cross-sectional area, collectively, is approximately the same as the cross-sectional area of a traditional solid conductor for a gradient coil. The conductors 92 may be solid or stranded, e.g., litz, and made of copper and/or other suitable conducting material. In embodiments, the conductors 92 may be enameled. Similar to the body 88, the conductors 92 may have a rectangular, circular, or other shape appropriate for driving the gradient coils 54.

As will be further appreciated, in embodiments, the passageway 90 may transport coolant, e.g., water, for cooling the conductors 92, i.e., coolant flows through the passageway 90. Accordingly, in some embodiments, the coolant may contact the conductors 92 while, in other embodiments, the conductors 92 may be completely isolated from the passageway 90 by the body 88 such that the coolant does not contact the conductors 92. In other words, in some embodiments, the body 88 retains the conductors 92 at a distance from the interior side 96 such that the conductors 92 do not come into contact with the coolant flowing through the passageway 90. In embodiments, where the conductors 92 are completely isolated from the passageway 90 by the body 88, glycol may be used as the coolant. Additionally, in embodiments, the passageway 90 may be reinforced via plastic tubing, e.g., syringe tubing, and/or other types of thin plastics that run along the interior side 96 of the body 88.

Figure 5:
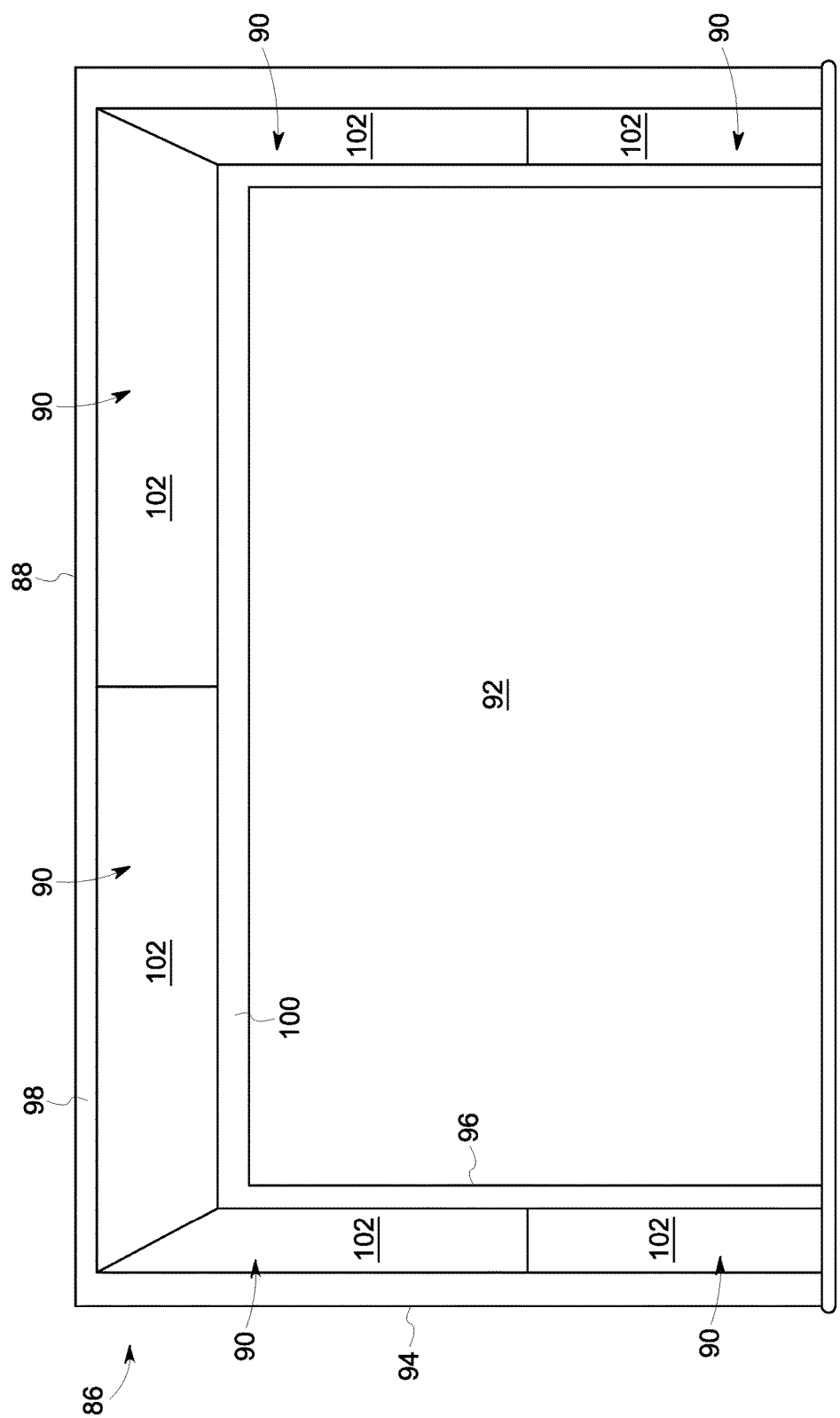
FIG. 5 is an axial cross-sectional view of yet another embodiment of the hollow conducting wire of FIG. 3 in accordance with an embodiment of the invention.

As illustrated in FIG. 5, in embodiments, the passageway 90 may be disposed between the exterior 94 of the body 88 and the one or more conductors 92. In such embodiments, the body 88 may form one or more insulation layers 98, 100 disposed on opposite sides of the passageway 90. As also shown in FIG. 5, in embodiments, the passageway 90 may be divided into multiple sections 102 which may be isolated from each other within the body 88.

Referring now to FIGS. 3 and 6, in embodiments, the conductors 92 may be rotated/twisted about the passageway 90 along the length L1 of the hollow conducting wire 86. For example, a conductor 92 may start at position 104 and rotate counterclockwise to positions 106, 108, and 110 such that the conductor 92 returns back to position 104. As will be appreciated, in embodiments, the conductors 92 may be rotated clockwise. Accordingly, in embodiments, the rate of rotation of the conductors 92 about the passageway 90 may be about one (1) rotation per meter.

Finally, it is also to be understood that the MRI system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the MRI system 10 may include at least one processor (e.g., 28, 40, and 76 in FIG. 1), and system memory/data storage structures (e.g., 30 and 72 in FIG. 1), which may include random access memory (RAM) and read-only memory (ROM). The at least one processor of the MRI system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that provides for driving the gradient coils 54 may be read into a main memory of the at least one processor from a computer-readable medium. The term "computer-readable medium", as used herein, refers to any medium that provides or participates in providing instructions to the at least one processor of the MRI system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, an MRI system for imaging a subject is provided. The MRI system includes a magnet assembly that includes a gradient coil having a hollow conducting wire. The hollow conducting wire includes a body defining a passageway, and one or more conductors disposed within the body around the passageway. In certain embodiments, the one or more conductors are further disposed between an exterior of the body and the passageway. In certain embodiments, the passageway is disposed between an exterior of the body and the one or more conductors. In certain embodiments, the body has at least one of a circular and rectangular shape. In certain embodiments, the passageway is for transporting a coolant that cools the one or more conductors. In certain embodiments, the coolant is glycol and the one or more conductors are isolated from the glycol. In certain embodiments, the one or more conductors are rotated about the passageway.

Other embodiments provide for a method for magnetic resonance imaging a subject. The method includes driving a gradient coil of a magnet assembly of an MRI system via a hollow conducting wire. The hollow conducting wire includes a body defining a passageway, and one or more conductors disposed within the body around the passageway. In certain embodiments, the method further includes cooling the one or more conductors via a coolant flowing through the passageway. In certain embodiments, the coolant is glycol and the one or more conductors are isolated from the glycol.

Yet still other embodiments provide for a hollow conducting wire for driving a gradient coil of a magnet assembly of an MRI system. The hollow conducting wire includes a body defining a passageway, and one or more conductors disposed within the body around the passageway. In certain embodiments, the one or more conductors are further disposed between an exterior of the body and the passageway. In certain embodiments, the passageway is disposed between an exterior of the body and the one or more conductors. In certain embodiments, the body has at least one of a circular and rectangular shape. In certain embodiments, the passageway is for transporting a coolant that cools the one or more conductors. In certain embodiments, the coolant is glycol and the one or more conductors are isolated from the glycol. In certain embodiments, the one or more conductors include multiple strands. In certain embodiments, the one or more conductors are rotated about the passageway. In certain embodiments, a rate of rotation of the conductors about the passageway is about one rotation per meter. In certain embodiments, the body includes nylon or ethylene.

Accordingly, as will be appreciated, by utilizing multiple relatively small conductors, as opposed to a single solid and relatively large conductor, the hollow conducting wire of some embodiments of the invention has the same amount of cross-sectional conducting area as comparable single solid gradient conducting wires while reducing the amount/magnitude of eddy currents generated in other components of the MRI system. Thus, some embodiments provide for a reduction in the amount of electrical resistance resulting from the magnetic field produced via the gradient coils, as compared to traditional gradient electrical conducting wires, which in turn lowers the amount of power needed to drive the gradient coils and the associated costs.

Further, by utilizing the passageway to transport coolant that cools the conductors, some embodiments of the invention provide for improved cooling of the gradient coil.

Further still, by utilizing multiple conductors, as opposed to a single large conductor, some embodiments of the invention provide for a hollow conducting wire that is flexible enough to be compatible with existing winding technologies.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. An MRI system for imaging a subject comprising:
a magnet assembly that includes a gradient coil having a hollow conducting wire, the hollow conducting wire including:
a body made of non-conductive material including an exterior side and an interior side defining a passageway, wherein the passageway is for transporting a coolant; and
one or more conductors disposed within the body between the exterior side and the interior side, wherein the non-conductive material fills the space between the exterior side and the interior side that is unoccupied by the one or more conductors, and wherein the one or more conductors are isolated from the coolant by the non-conductive material.

2. The MRI system of claim 1, wherein the passageway has a circular or rectangular shape.

3. The MRI system of claim 1, wherein the coolant is glycol and the one or more conductors are isolated from the glycol.

4. The MRI system of claim 1, wherein the one or more conductors are rotated about the passageway.

5. A method for magnetic resonance imaging a subject comprising:

driving a gradient coil of a magnet assembly of an MRI system via a hollow conducting wire that includes:
  a body made of non-conductive material including an exterior side and an interior side defining a passageway; and
  one or more conductors disposed within the body between the exterior side and the interior side, wherein the non-conductive material fills the space between the exterior side and the interior side that is unoccupied by the one or more conductors; and
cooling the one or more conductors via a coolant flowing through the passageway,
wherein the one or more conductors are isolated from the coolant by the non-conductive material.

6. The method of claim 5, wherein the coolant is glycol and the one or more conductors are isolated from the glycol.

7. A hollow conducting wire for driving a gradient coil of a magnet assembly of an MRI system, the hollow conducting wire comprising:
  a body made of non-conductive material including an exterior side and an interior side defining a passageway, wherein the passageway is for transporting a coolant; and
  one or more conductors disposed within the body between the exterior side and the interior side, wherein the non-conductive material fills the space between the exterior side and the interior side that is unoccupied by the one or more conductors, and wherein the one or more conductors are isolated from the coolant by the non-conductive material.

8. The hollow conducting wire of claim 7, wherein the passageway has a circular or rectangular shape.

9. The hollow conducting wire of claim 7, wherein the coolant is glycol and the one or more conductors are isolated from the glycol.

10. The hollow conducting wire of claim 7, wherein the one or more conductors comprise of multiple strands.

11. The hollow conducting wire of claim 7, wherein the one or more conductors are rotated about the passageway.

12. The hollow conducting wire of claim 11, wherein a rate of rotation of the conductors about the passageway is about one rotation per meter.

13. The hollow conducting wire of claim 7, wherein the non-conductive material comprises of nylon or ethylene.

14. A gradient coil for a magnet assembly of an MRI system for imaging a subject, the gradient coil comprising:
  a hollow conducting wire for driving the gradient coil, the hollow conducting wire including:
    a body made of non-conductive material including an exterior side and an interior side defining a passageway, wherein the passageway is for transporting a coolant; and
    one or more conductors disposed within the body between the exterior side and the interior side, wherein the non-conductive material fills the space between the exterior side and the interior side that is unoccupied by the one or more conductors, and wherein the one or more conductors are isolated from the coolant by the non-conductive material.

* * * * *